United States Patent [19]

Sugayama

[11] Patent Number: 5,204,973

[45] Date of Patent: Apr. 20, 1993

[54] RECEIVER CAPABLE OF QUICKLY SUPPRESSING DEFECTIVE EFFECT OF MULTIPATH REFLECTION INTERFERENCE

[75] Inventor: Sakae Sugayama, Ora, Japan

[73] Assignee: Sanyo Electric Co., Ltd., Osaka, Japan

[21] Appl. No.: 612,392

[22] Filed: Nov. 13, 1990

[30] Foreign Application Priority Data

Nov. 17, 1989 [JP] Japan .................................. 1-300246
Nov. 17, 1989 [JP] Japan .................................. 1-300248

[51] Int. Cl.$^5$ ............................................. H04B 1/10
[52] U.S. Cl. ................................. 455/212; 455/222; 455/297; 455/311
[58] Field of Search ............... 455/296, 297, 311, 212, 455/213, 218, 219, 222, 223

[56] References Cited

U.S. PATENT DOCUMENTS

| | | | |
|---|---|---|---|
| 3,982,186 | 9/1976 | Furuno | 325/344 |
| 4,283,793 | 8/1981 | Numata | 455/213 |
| 4,390,749 | 6/1983 | Pearson | 455/297 |
| 4,403,348 | 9/1983 | Leland et al. | 455/203 |
| 4,426,727 | 1/1984 | Hamada | 455/296 |
| 4,466,129 | 8/1984 | Skutta | 455/219 |
| 4,703,501 | 10/1987 | Sugai et al. | 455/297 |
| 4,881,274 | 11/1989 | Tazaki et al. | 455/296 |

OTHER PUBLICATIONS

Patent Abstracts of Japan, vol. 5, No. 55 (E-52) dated Apr. 16, 1981 and JP-A-56 006 542 dated Jan. 23, 1981.
Patent Abstracts of Japan, vol. 6, No. 251 (E-147) dated Dec. 10, 1982 and JP-A-57 033 834.
Patent Abstracts of Japan, vol. 6, No. 103 (E-112) dated Jun. 12, 1982 and JP-A 57 033 834.

Primary Examiner—Reinhard J. Eisenzopf
Assistant Examiner—Edward Urban
Attorney, Agent, or Firm—Darby & Darby

[57] ABSTRACT

A FM receiver quickly suppressing defective effect of multipath reflection interference is disclosed. A field strength detecting circuit (8) is responsive to output signals from preceding stage amplifiers (51) in an IF amplifying circuit (5) for detecting the field strength of the received signal. In response to the field strength detecting circuit (8), a soft muting control circuit (10) is operated, whereby a muting circuit (7) gradually mutes the output signal of a detector circuit (6). Furthermore, an alternate current signal detecting circuit (12) detects the alternate current signal component included in the output signal from the field strength detecting circuit (8), whereby the occurrence of multipath reflection interference is detected. In the case of multipath reflection interference, the gain of the succeeding stage amplifier (52) in the IF amplifying circuit (5) is quickly reduced by the alternate current signal detecting circuit (12) to prevent unpleasant noise due to multipath reflection interference from being generated from the speaker.

12 Claims, 4 Drawing Sheets

RECEIVER CAPABLE OF QUICKLY SUPPRESSING DEFECTIVE EFFECT OF MULTIPATH REFLECTION INTERFERENCE

BACKGROUND OF THE INVENTION

1. Field of the Invention

The present invention relates generally to receiver devices, and more particularly, to a receiver device that can quickly suppress the adverse effect of multipath reflection interference. The invention has particular applicability to FM receivers incorporated in mobile units such as an automobile.

2. Description of the Background Art

A radio receiver or a radio broadcasting receiver carried within a mobile unit such as an automobile receives signals having a field strength varying in accordance with the location of the mobile unit. Regarding a radio broadcasting receiver incorporated in an automobile, the field strength of the reception signal varies as the automobile moves. The present invention can generally be applied to a receiver device provided in a mobile unit. A radio broadcasting receiver provided in an automobile will be taken as an example in the description hereinafter.

The field strength of the reception signal received by a radio receiver in an automobile varies in accordance with the travel of the automobile. When the automobile is between a large structure such as a building, the field strength of the reception signal is reduced significantly. Thus, noise components in the reception signal suddenly increase to generate unpleasant noise through the speaker of the radio receiver.

A radio receiver is often provided with a muting circuit, called a "soft muting circuit," for the purpose of suppressing the generation of such noise. This muting circuit gradually reduces the level of the sound signal generated from the receiver as the field strength of the reception signal becomes weaker. This prevents the generation of unpleasant noise through the speaker.

Referring to FIG. 1, curves C1 and C2 in solid lines show the sound signal level and the noise level in the case where muting processing is not applied. Curves C3 and C4 in single dot dashed lines respectively show the sound signal level and the noise level in the case where muting processing is applied. It can be appreciated from the figure that in the case where muting processing is not applied, the levels of the sound signal and the noise are both not reduced, that is to say, not muted, when the field strength of the reception signal is low (curves C1 and C2). In the case where muting processing is applied, the levels of the sound signal and the noise are both reduced, that is to say muted, when the field strength of the sound signal is low (curves C3 and C4). By applying muting processing to the sound signal, the level of the sound generated from the speaker is lowered in accordance with the field strength of the reception signal to eliminate the unpleasant noise caused by the noise.

A conventional soft muting circuit operates gradually as the field strength of the reception signal is lowered. Therefore, when the field strength of the reception signal suddenly changes such as in the case of multipath reflection interference, the function of muting could not operate so quickly. Therefore, when the electric field of the reception signal suddenly changes due to multipath reflection interference, noise unpleasant to the ear was generated from the speaker because the noise could not be suppressed.

The above mentioned multipath reflection interference is generated as follows. Because radio waves are reflected by buildings and mountains, reception signals include reflected waves arriving through various paths, in addition to the transmitted radio waves directly sent from a transmitter. Interference occurs between the received radio waves to increase the noise level.

SUMMARY OF THE INVENTION

An object of the present invention is to quickly suppress defective effect arising from sudden change in the field strength of a reception signal in a receiver.

Another object of the present invention is to quickly suppress defective effect arising from multipath reflection interference in a receiver device.

BRIEF DESCRIPTION OF THE INVENTION

Briefly stated, a receiver device in accordance with the present invention includes a reception circuit for receiving high frequency signals modulated by a predetermined modulation method, a frequency converting circuit for converting the received high frequency signal into an intermediate frequency signal having an intermediate frequency, an intermediate frequency amplifying circuit for amplifying the intermediate frequency signal, a field strength detecting circuit responsive to the intermediate frequency amplifying circuit for detecting the field strength of the received high frequency signal, a level reducing circuit responsive to the field strength detecting circuit for reducing the level of the output signal provided from the intermediate frequency amplifying circuit, an interference detecting circuit for detecting multipath reflection interference occurring in the received high frequency signal, and a reduction accelerating circuit responsive to the interference detecting circuit for accelerating the reduction of the level of the output signal from the level reducing circuit.

In operation, the interference detecting circuit detects multipath reflection interference occurring in the received high frequency signal, whereby the reduction accelerating circuit accelerates the reduction of the level of the output signal generated from the level reducing circuit. It is possible to quickly reduce the level of the output signal generated from the intermediate frequency amplifying circuit when multipath reflection interference occurs. In other words, it is possible to rapidly suppress the adverse effect of multipath reflection interference.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 2:
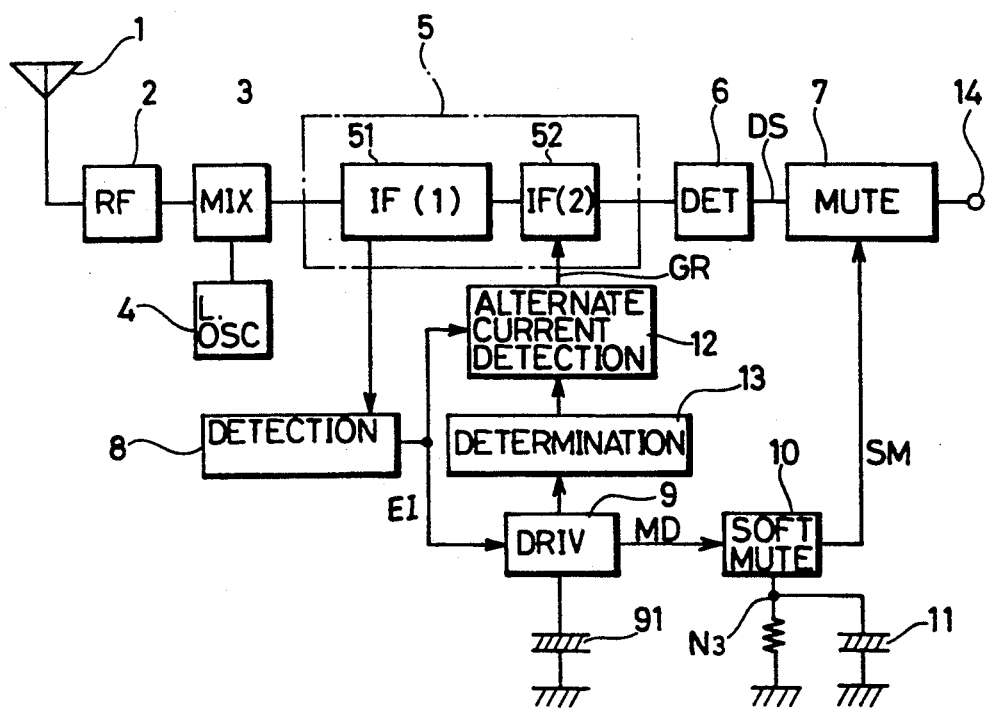
FIG. 2 is a block diagram of a FM receiver of an embodiment of the present invention.

Referring to FIG. 2, an FM receiver comprises an antenna 1 for receiving a transmitted high frequency signal (referred to as a "RF signal" hereinafter), an RF amplifying circuit 2 for amplifying the received RF signal, a mixing circuit 3 for mixing the amplified RF signal and the local oscillating signal generated from a local oscillating circuit 4, an IF amplifying circuit for amplifying the intermediate frequency signal (referred to as a "IF signal" hereinafter) obtained by mixing, a detector circuit 6 for FM detecting the amplified IF signal, and a muting circuit 7 for muting the output signal generated from detector circuit 6. The FM receiver further includes a field strength detecting circuit 8 for detecting the field strength of the received high frequency signal, a driving circuit 9 responsive to the field strength signal EI generated from field strength detecting circuit 8 for generating a soft muting driving signal MD, a soft muting control circuit 10 for controlling muting circuit 7, and an alternate current signal detecting circuit 12 for detecting the alternate current signal component comprised in the field strength signal EI generated from field strength detecting circuit 8. Field strength detecting circuit 8 is connected to receive the output signals of preceding stage amplifiers 51 in IF amplifying circuit 5. Alternate current signal detecting circuit 12 controls the gain of a succeeding stage amplifier 52 in IF amplifying circuit 5.

The operation will be explained hereinafter. In the case where the RF signal received via antenna 1 has an intensive field strength, field strength detecting circuit 8 is responsive to the output signals generated from the preceding stage amplifiers 51 to provide a field strength signal EI of high level. Driving circuit 9 is responsive to a high level signal EI to generate a soft muting driving signal MD of low level. Because soft muting control signal 10 generates a soft muting signal SM of low level, muting circuit 7 does not carry out muting operation. As a result, the output signal DS generated from detector circuit 6 is provided via output terminal 14 without being muted.

Figure 1:
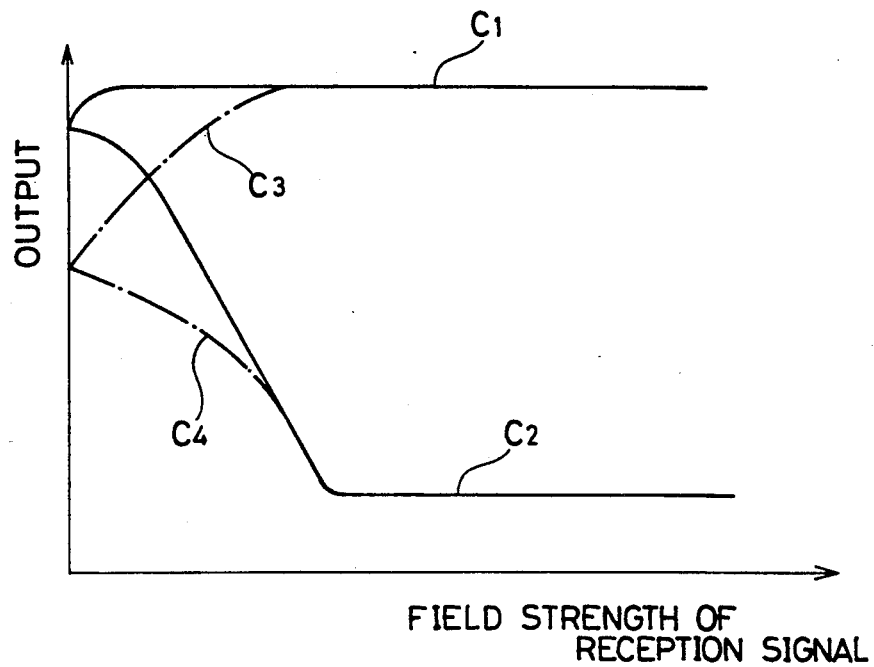
FIG. 1 is a muting characteristic diagram for explaining the function of a soft muting circuit.

In the case the received RF signal has a weak field strength, field strength detecting circuit 8 is responsive to the output signals generated from the preceding stage amplifiers 51 to provide a field strength signal EI of low level. Driving circuit 9 is responsive to the low level signal EI to provide a high level muting driving signal MD. Capacitor 11 connected to soft muting control circuit 10 is responsive to the high level signal MD to be charged. As capacitor 11 is charged, the level of soft mute signal SM generated from soft muting control circuit 10 becomes high, whereby the muting effect of muting circuit 7 is increased. In other words, after the detection of weak field strength of the RF signal, muting circuit 7 gradually decreases the output signal DS generated from detector circuit 6. This means that "soft muting" processing is carried out, as shown in curves C3 and C4 of FIG. 1.

The FM receiver operates as follows in the case where multipath reflection interference occurs in the RF signal received via antenna 1. Because of multipath reflection interference, the field strength signal EI generated from field strength detecting circuit 8 comprises an alternate current signal having a large amplitude. Alternate current signal detecting circuit 12 is responsive to the alternate current signal component included in signal EI to detect that multipath reflection interference is generated. To reduce the gain of the succeeding stage amplifier 52 in IF amplifying circuit 5, alternate current signal detecting circuit 12 generates a gain reducing signal GR for providing the same to the succeeding stage amplifier 52. In response to signal GR, the gain of the succeeding stage amplifier 52 is reduced. The reduction of gain of the succeeding stage amplifier 52 causes reduction of the entire gain of IF amplifying circuit 5. This is equivalent to the implementation of muting function. This means that the level of the output signal generated from IF amplifying circuit 5 can be reduced without muting circuit 7 being operated, i.e., before muting circuit 7 operates. An operation equivalent to muting function starts promptly after the occurrence of multipath reflection interference. Thus the generation of unpleasant noise from the speaker particular to multipath reflection interference is suppressed.

In the case where the field strength of the received RF signal is low, the level of white noise will rise. Alternate current signal detecting circuit 12 will detect the alternate current signal included in this white noise. In other words, alternate current signal detecting circuit 12 operates even though multipath reflection interference is not generated, and the gain of the succeeding stage amplifier 52 is reduced. To prevent the operation of the alternate current signal detecting circuit due to white noise, the solution explained hereinafter is applied.

The FM receiver further includes a determination circuit 13 for making determination that the field strength of the received RF signal has dropped below a predetermined level. Determination circuit 13 detects that the field strength is below a predetermined level to cease the operation of alternate current signal detecting circuit 12. Because the direct current signal component included in the signal generated from driving circuit 9 is proportional to the field strength of RF signal, it is possible to determine whether the detected alternate current signal component is due to white noise or due to multipath reflection interference, by the determination of the level of direct current signal component. As a result, the alternate current signal arising from white noise is prevented from being detected by circuit 12.

Only the alternate current signal component arising from multipath reflection interference is detected, whereby gain of the succeeding stage amplifier 52 is reduced. In other words, when the field strength of the RF signal is low, the FM receiver does not detect the generation of multipath reflection interference. When the field strength of the RF signal exceeds a predetermined level, the generation of multipath reflection interference is detected to reduce the gain of the succeeding stage amplifier 52.

Figure 3:
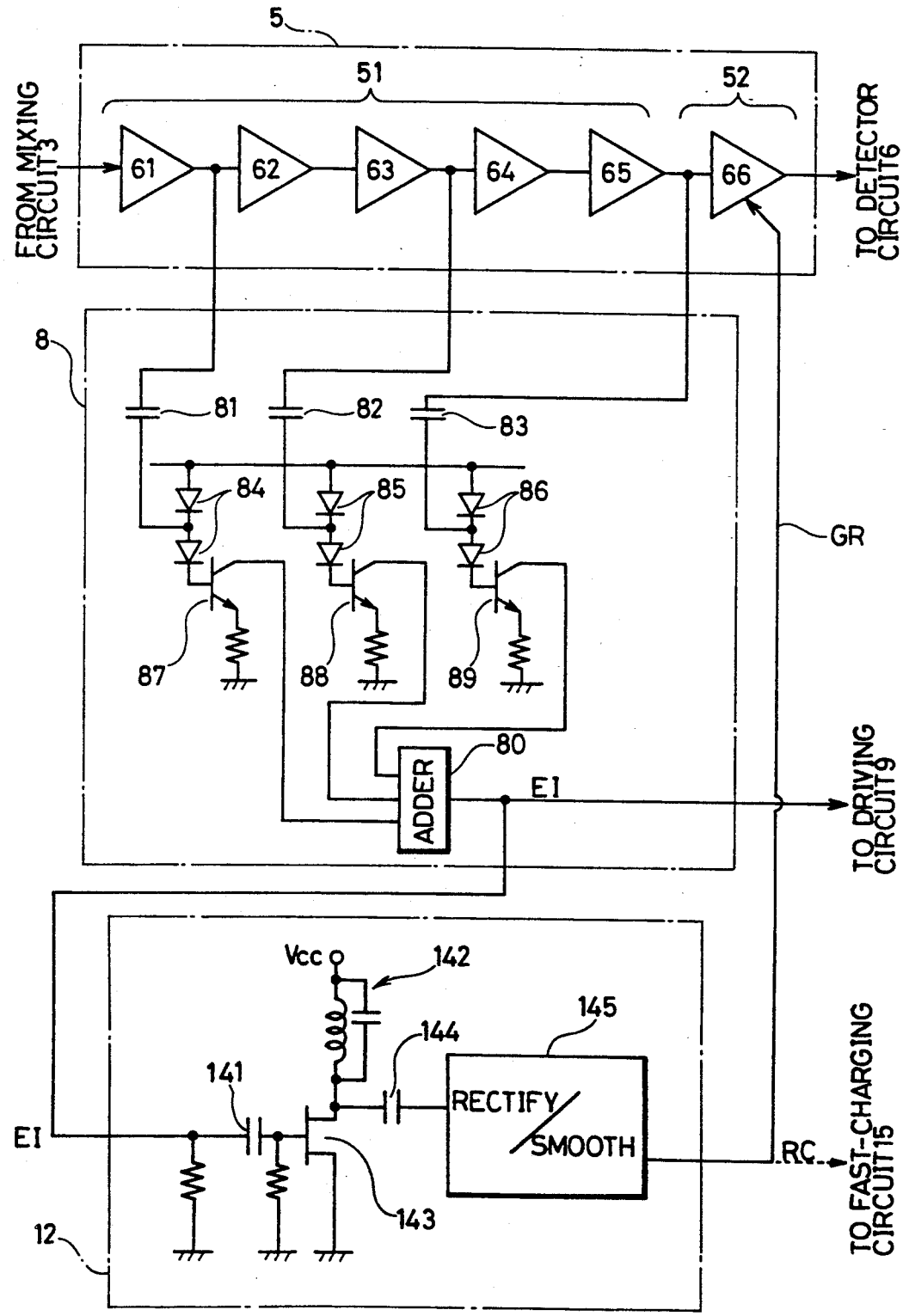
FIG. 3 is a circuit diagram of an example of the field strength detecting circuit and the alternate current signal detecting circuit of FIG. 2.

FIG. 3 shows examples of IF amplifying circuit 5, field strength detecting circuit 8, and alternate current signal detecting circuit 12. Referring to FIG. 3, IF amplifying circuit 5 comprises limiter amplifiers 61–66 cascaded across 6 stages for ensuring a high amplification factor and linearity in a wide range. In the present embodiment, the output signals of limiter amplifiers 61, 63 and 65 of the first stage, the third stage, and the fifth stage, are applied to field strength detecting circuit 8. Limiter amplifiers 61–65 form the preceding stage amplifiers 51 of FIG. 2, whereas limiter amplifier 66 forms the succeeding stage amplifier 52. Although the output signals of amplifiers 61, 63 and 65 are provided to field strength detecting circuit 8, the field strength of the RF signal may be detected by providing the arbitrary output signals out of limiter amplifiers 61–65 to field strength detecting circuit. In this case, it is necessary to select the output signals from amplifiers 61–65 preceding limiter amplifier 66, i.e., the succeeding stage amplifier 52 having the gain thereof controlled.

Field strength detecting circuit 8 comprises capacitors 81, 82 and 83 selectively passing only the alternate current signal components generated from IF amplifying circuit 5, diodes 84, 85 and 86 for detecting the alternate current signal components, npn transistors 87, 88, and 89 for amplifying the detected signals, and an adder circuit 80 for adding the amplified signals. In accordance with the alternate current signal component of the output signals generated from limiter amplifiers 61, 63 and 65 in IF amplifying circuit 5, a field strength signal EI having a direct current level proportional to the field strength of RF signal is generated via adder circuit 80. Signal EI is applied to alternate current signal detecting circuit 12 and to driving circuit 9 for soft muting.

Alternate current signal detecting circuit 12 comprises a capacitor 141 for passing only the alternate current signal component included in the applied signal EI, a load circuit 142 and a field effect transistor (FET) 143 connected in series between power supply Vcc and ground, a capacitor 144 for passing the amplified alternate current signal component, and a rectifying/smoothing circuit 145 for rectifying and smoothing the alternate current signal component. The amplifying circuit constituted by load circuit 142 and FET 143 amplify the alternate current signal component included in signal EI, whereby the amplified signal is rectified by the rectifying/smoothing circuit. A signal GR indicating a sudden change in field strength is generated from alternate current signal detecting circuit 12. In response to signal GR, the gain of the sixth stage limiter amplifier 66 is controlled. In other words, when the field strength suddenly changes, the gain of limiter amplifier 66 is reduced.

Figure 4:
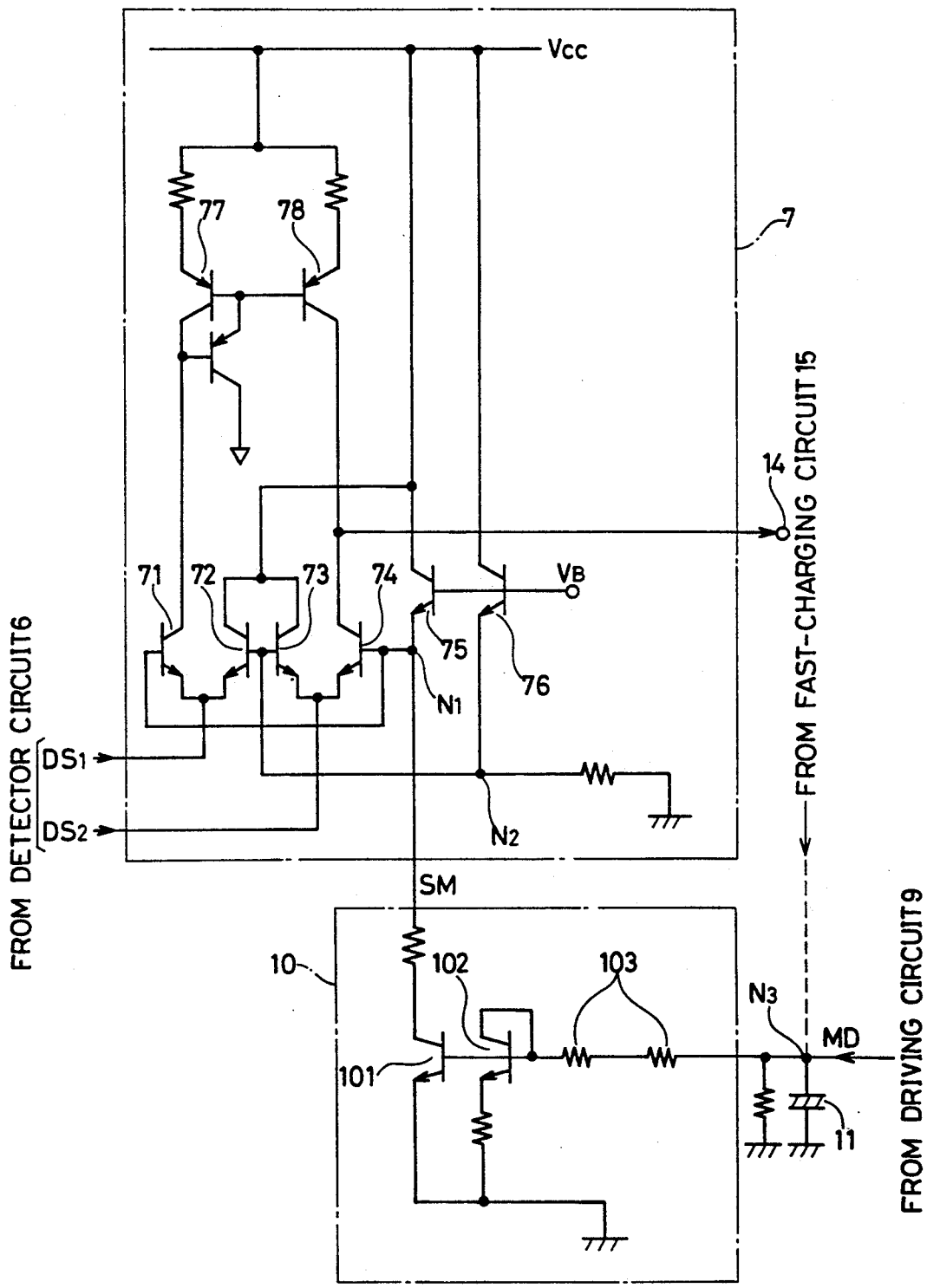
FIG. 4 is a circuit diagram of an example of the muting circuit and the soft muting control circuit of FIG. 2.

FIG. 4 shows an example of muting circuit 7 and soft muting control circuit 10 of the FIG. 2. Referring to FIG. 4, muting circuit 7 comprises npn transistors 71 and 72 implementing a first differential amplifier, npn transistors 73 and 74 implementing a second differential amplifier, npn transistors 75 and 76 for applying bias to the first and second differential amplifiers, and pnp transistors 77 and 78 implementing a current mirror circuit. The emitters of transistors 71 and 72 are connected together. The detected signal DS$_1$ generated from detector circuit 6 is applied to this common connection node. The emitters of transistors 73 and 74 are also connected together, and the detected signal DS$_2$ is provided to the common connection node from detector circuit 6. Signals DS$_1$ and DS$_2$ generated from detector circuit 6 are inverted with each other. The collector of transistor 74 is connected to output terminal 14, whereby the muted (or not muted) output signal is generated via terminal 14. Transistors 75 and 76 have the bases connected to receive a predetermined bias voltage V$_B$. The base of transistor 74 and the emitter of transistor 75 are connected to each other at node N1. Node N1 is connected to receive soft muting signal SM generated from soft muting control circuit.

The operation will be described hereinafter. When signal SM is not provided, the first and second differential amplifiers are under a balanced state because the potentials of nodes N1 and N2 are brought to the same level. In response to signals DS$_1$ and DS$_2$ provided from detector circuit 6, an output signal not muted is provided from terminal 14. The potential of node N1 is controlled in response to signal SM generated from soft muting control circuit 10, whereby the balanced state of the first and second differential amplifiers changes. In other words, the base potentials of transistors 71 and 72 changes in response to signal SM. As a result, an output signal muted in accordance with signal SM is generated via a terminal 14.

Soft muting control circuit 10 comprises two npn transistors 101 and 102, and a resistor 103. Transistors 101 and 102 have their bases connected to node N3 via resistor 103. A capacitor 11 for soft muting processing is connected between node N3 and ground. Node N3 is connected to receive signal MD generated from soft muting driving circuit 9 of FIG. 2.

In operation, one electrode of capacitor 11, i.e., node N3 is charged in response to signal MD. As node N3 is charged, transistor 101 is gradually turned on. In other words, the potential of node N1 within muting circuit 7 rises. As the potential of node N1 rises, the output signal generated from muting circuit 7 is gradually muted.

Figure 5:
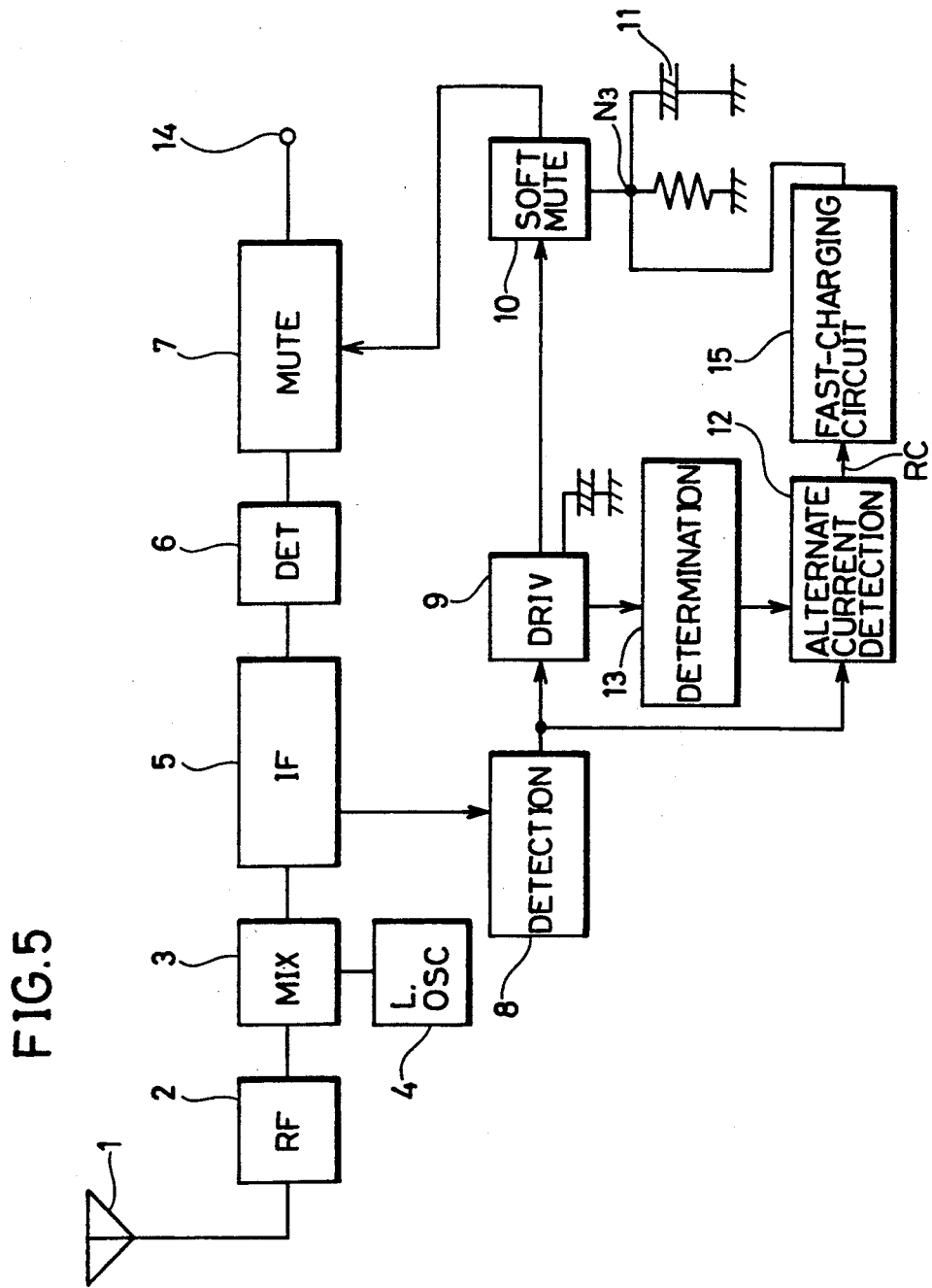
FIG. 5 is a block diagram of an FM receiver of another embodiment of the present invention.

A FM receiver of a second embodiment is shown in FIG. 5. Referring to FIG. 5, this FM receiver is provided with a fast-charging circuit 15 for quickly charging one node N3 of capacitor 11, as a substitute for controlling the succeeding stage amplifier of IF amplifying circuit 5. Fast-charging circuit 15 is connected to receive a fast-charge request signal RC generated from alternate current signal detecting circuit 12. Signal RC is generated from circuit 12 of FIG. 3, for example. Signal RC is turned to a higher level when the field strength of the received RF signal suddenly changes to operate fast-charging circuit 15. Node N3 is quickly charged by fast-charging circuit 15.

Referring to FIG. 4 again, the potential of node N3 quickly increases because node N3 is rapidly charged by fast-charging circuit 15. Transistor 75 is quickly turned on, whereby the output signal generated via terminal 14 is muted.

It is noted that the FM receiver of FIG. 5 comprises a determination circuit 13, similarly to the FM receiver of FIG. 2. Because determination circuit 13 is provided, alternate current signal detecting circuit 12 is prevented from operating in response to white noise when the field strength of the received signal is low. Because the alternate current signal component according to white noise is not detected by circuit 12, fast-charging circuit 15 does not operate.

The FM receivers shown in FIGS. 2 and 5 comprise an alternate current signal detecting circuit 18 for detecting the alternate current signal component included in the fields strength signal EI detected by field strength detecting circuit 8. Therefore, the occurrence of multipath reflection interference in the received RF signal can be detected. In the FM receiver of FIG. 2, the gain of the succeeding stage amplifier 52 within IF amplifying circuit 5 is quickly reduced in response to the occurrence of multipath reflection interference. The reduction of gain of amplifier 52 is equivalent to the quick operation of muting circuit 7. In a similar manner, the FM receiver of FIG. 5 has node N3 quickly charged by fast-charging circuit 15 when multipath reflection interference is detected. This means that muting circuit 7 is quickly operated. It is possible to prevent unpleasant noise from being generated via the speaker because the level of the output signal can be quickly reduced in case of multipath reflection interference. Furthermore, alternate current signal detecting circuit 12 is prevented from detecting the alternate current signal component due to white noise, when the field strength of the received RF signal is low, because determination circuit 13 is provided in the embodiments. This means that quick muting is not carried out when detecting white noise.

Although the FM receivers of FIGS. 2 and 5 may be used as a radio broadcasting receiver for automobiles, the invention is not limited to this, and can be applied to receiver circuits of radio devices incorporated in mobile units.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A radio receiver comprising:
   means for receiving a modulated radio frequency signal,
   means connected to said receiving means for converting the received modulated radio frequency signal into an intermediate frequency signal,
   means connected to said frequency converting means for amplifying the intermediate frequency signal,
   means connected to said intermediate frequency signal amplifying means for producing a final signal,
   means responsive to the intermediate frequency signal for detecting the field strength of the received modulated radio frequency signal,
   first means responsive to the level of the detected field strength for reducing at a first rate the level of said final signal,
   means for detecting the alternate current signal component of the detected field strength for detecting multipath reflection interference occurring in the received modulated radio frequency signal, and
   second means responsive to the output of said interference detecting means for rapidly reducing the level of said final signal at a second rate faster than said first rate.

2. The receiver according to claim 1, wherein said field strength detecting means comprises detection means for detecting a current component included in the output signal from said intermediate frequency amplifying means to be applied to said first means.

3. The receiver according to claim 2, wherein
   said field strength detecting means comprises diode means for detecting the output signal of said first amplifier means of said plurality of cascaded amplifier means,
   said field strength detecting means further comprises adder means for adding the output signal from said diode means, and
   said interference detecting means detects the alternate current signal component included in the output signal from said adder means.

4. The receiver according to claim 2, further comprising comparing means connected to said field strength detecting means for comparing the level of the signal component detected by said field strength detecting means and a predetermined level,
   wherein said second means ceases reduction operation in response to said comparing means.

5. The receiver according to claim 4, wherein said alternate current signal detecting means ceases the detecting operation of the alternate current signal component in response to said comparing means.

6. The receiver according to the claim 1, wherein
   said intermediate frequency signal amplifying means comprises a plurality of cascaded amplifier means,
   said field strength detecting means detects the field strength of the received modulated radio frequency signal in response to the output signal generated from a first amplifier means of said plurality of cascaded amplifier means preceding the last stage thereof, and
   said second means comprises means for reducing the gain of an amplifier means of said plurality of cascaded amplifier means after said first amplifier means.

7. The receiver according to claim 1, wherein said first means comprises
   capacitor means,
   charging means responsive to the output signal from said field strength detecting means for charging said capacitor means, and
   muting circuit means responsive to the charged potential of said capacitor means for muting the level of the output signal of said intermediate frequency amplifying means.

8. The receiver according to claim 7, wherein said second means comprises charge accelerating means responsive to said interference detecting means for accelerating the charge function of said charging means.

9. The receiver according to claim 7 wherein said second means comprises means for reducing the level of the output signal of said intermediate frequency amplifying means.

10. The receiver according to claim 1, further comprising demodulating means connected to the output of said intermediate frequency amplifying means for demodulating the output signal from said intermediate frequency amplifying means,
    said first level reducing means reducing the level of the output signal of said demodulating means in response to said field strength detecting means.

11. The receiver according to claim 1 wherein said second means comprises means for reducing the level of the output signal of said intermediate frequency amplifying means.

12. The receiver according to claim 1, further comprising means for disabling the detection of the alternate current signal component in response to a debited field strength below a predetermined level.

* * * * *